United States Patent [19]
Batten, Jr. et al.

[11] Patent Number: 6,097,613
[45] Date of Patent: Aug. 1, 2000

[54] ASSEMBLIES OF ELECTRONIC DEVICES AND FLEXIBLE CONTAINERS THEREFOR

[75] Inventors: L. Eugene Batten, Jr., Angier; Dennis A. McCulloch, Chapel Hill, both of N.C.

[73] Assignee: Nortel Networks Limited, Montreal, Canada

[21] Appl. No.: 08/989,812

[22] Filed: Dec. 12, 1997

[51] Int. Cl.[7] .................................................. H05K 9/00
[52] U.S. Cl. ...................... 361/816; 361/799; 361/800; 361/816; 361/818; 174/35 R; 439/76.1
[58] Field of Search .................... 361/799, 800, 361/816, 818; 174/35 R, 35 GC; 439/67, 76.1

[56] References Cited

U.S. PATENT DOCUMENTS

| | | | |
|---|---|---|---|
| 4,800,461 | 1/1989 | Dixon et al. | 361/398 |
| 5,394,304 | 2/1995 | Jones | 361/765 |
| 5,436,803 | 7/1995 | Amis et al. | 361/818 |
| 5,545,494 | 8/1996 | Trumble et al. | 429/163 |
| 5,739,463 | 4/1998 | Diaz et al. | 174/35 R |

*Primary Examiner*—Leo P. Picard
*Assistant Examiner*—Tuan Dinh
*Attorney, Agent, or Firm*—Foley & Lardner

[57] ABSTRACT

An assembly of an electronic device within a chamber defined by a flexible container. The device, which may be a printed circuit board, has signal terminals connected to elongate insulated signal conductors. These conductors pass through a laminate construction wall of the container for connection to an outside electrical conductor. The signal conductors are electrically isolated from an EMI protection layer which forms part of the laminate construction wall. A ground conductor extends through the wall and is separated from the wall by a dielectric spacer to provide a capacitive coupling between the EMI protection layer and the ground conductor. The capacitive coupling produces a desired capacitive effect for shorting certain electrical frequencies from the EMI protection layer to ground. Conveniently, a flat cable provides the signal and ground conductors and the cable extends through a sealed opening of the container.

14 Claims, 2 Drawing Sheets

ASSEMBLIES OF ELECTRONIC DEVICES AND FLEXIBLE CONTAINERS THEREFOR

This invention relates to electronic devices within flexible containers.

In the electronics industry, electronic devices, e.g. printed circuit boards, are conventionally incorporated into equipment. Depending upon the usage of printed circuit boards particularly, it may be required to prevent electromagnetic radiation from passing to or from electronic components mounted upon the boards because of the electromagnetic interference (EMI) which results. Up to the present time it has been conventional practice to provide EMI shielding around an entire printed circuit board by housing the printed circuit board with a conductive rigid metal shield forming part of an assembly with the printed circuit board. The metal shield is grounded to provide the required EMI protection. An electrical connector is necessary to connect the printed circuit board with electrical equipment or a power source exteriorly of the shield. Conventional arrangements have proved to be unsatisfactorily expensive, occupy an inordinately large spacial volume as compared to the volume of the printed circuit board and its electronic components, and require many manufacturing steps.

In an effort to overcome the above problems, a U.S. Pat. No. 5,545,494 to W. P. Trumble et al, describes an assembly of printed circuit board and a flexible container around the board and in which EMI protection is provided by a conductive flexible metal layer as an inner layer of the container wall. The container has an opening within which a connector of the board is mounted with the opening to the container being sealed around a peripheral surface of the body of the connector. Not only is EMI protection provided, but also the inside of the container and thus the printed circuit board and its electronic components are protected from dust and any other airborne contamination. The problem with the construction described in the above Patent is that the connector body needs to be sufficiently large in size for the container to seal around it at the container opening. A body of this size is much larger than would otherwise be necessary merely to be mounted upon a printed circuit board for conveying signals to and from the board. The structure is therefore cumbersome.

The present invention seeks to provide a solution to the above problems in connecting an electronic device within a flexible container to external electrical means and also to provide an efficient ground for the electrical device.

Accordingly, the present invention provides an assembly of a flexible container and an electronic device comprising:—a flexible container defining a sealed chamber and comprising a laminate construction wall which includes a dielectric layer facing inwardly into the chamber and an EMI protection layer surrounding the dielectric layer; an electronic device located within the chamber and having a plurality of signal terminals for the device; a plurality of elongate individually electrically insulated signal conductors each electrically connected to an individual signal terminal of the device and extending outwardly from the chamber for connection to electrical means outside the container, each signal conductor passing through the wall while being electrically isolated from the EMI protection layer; and a ground conductor extending through the laminate construction wall and separated from the EMI protection layer by a dielectric spacer to provide a capacitive coupling between the EMI protection layer and the ground conductor to produce a desired capacitive effect for shorting certain electrical frequencies from the EMI protection layer to ground.

The inventive assembly provides a sealed chamber to protect the electronic device and prevent harmful electromagnetic radiation from passing through the EMI protection layer while conveniently and simply providing for electrical connection of the electronic device to external electrical means and providing a ground for the EMI protection layer.

In a preferred arrangement of the above assembly according to the invention, the laminate construction wall comprises three layers, the third layer comprising a further dielectric layer surrounding the EMI protection layer.

As may be seen from the invention defined above, the EMI protection layer is grounded by capacitive means. In a convenient and preferred arrangement, the ground conductor and the signal conductors form parts of a common electrical cable which extends from the device and out from the chamber. Hence, in this preferred arrangement, a dielectric jacket of the cable which surrounds the signal and ground conductors conveniently provides the dielectric spacer which separates the EMI protection layer from the ground conductor.

In a practical construction, the container has a sealed opening. Before sealing, the opening provided for insertion of the device into the chamber, and the cable extends through the sealed opening and between regions of the container at the opening which are sealed to the jacket of the cable.

Where a cable is employed, as in the preferred arrangement, the ground conductor is conveniently an electrically conductive layer surrounding the signal conductors. This ground conductor may be an imperforate layer or have a braided construction.

The capacitive effect is at least partly dependent on the distance apart of the EMI protection layer and the ground conductor through the dielectric spacer at the sealed opening, but is also partly dependent on the overlapping cross-sectional areas of the EMI protection layer and the ground conductor at the sealed opening. In some cases it may be found that a ground conductor completely surrounding the signal layers would provide an undesirable capacitive effect. In such cases, a ground layer which extends only for a certain determined circumferential distance around the cable may provide the amount of overlapping cross-sectional areas of ground conductor and EMI protection layer for the desired capacitive effect.

To provide the desired capacitive effect with the required overlapping cross-sectional areas of ground conductor and EMI protection layer, at the sealed opening, the dielectric layer which faces inwardly into the chamber extends along and is sealed to the cable jacket for a desired axial length of the cable. This disposes the EMI protection layer substantially parallel to the ground conductor along this axial length.

In constructions according to a preferred form of the invention, the electrical cable is preferably a flat cable which has flat sides convenient for sealing to the laminate construction wall of the container. Alternatively, the cable is substantially circular in cross-section.

The invention also includes a method of providing an assembly of a flexible container and an electronic device comprising;—providing a flexible container defining a chamber and comprising a laminate construction wall which includes a dielectric layer facing inwardly into the chamber and an EMI protection layer surrounding the dielectric layer; passing an electronic device through an opening in the flexible container and into the chamber and causing a plurality of individually insulated elongate signal conductors to extend from signal terminals of the device and from the chamber through the opening to the exterior of the chamber, and also causing a ground conductor to extend through the opening to the exterior of the device; and sealing the opening during which regions of the container at the opening are sealed around the cable with the EMI protection layer separated from the ground conductor by a dielectric spacer so as to capacitively couple the EMI protection layer with the ground conductor and provide a desired capacitive effect for shorting certain electrical frequencies to ground.

Embodiments of the invention will now be described, by way of example, with reference to the accompanying drawings, in which.

Figure 1:
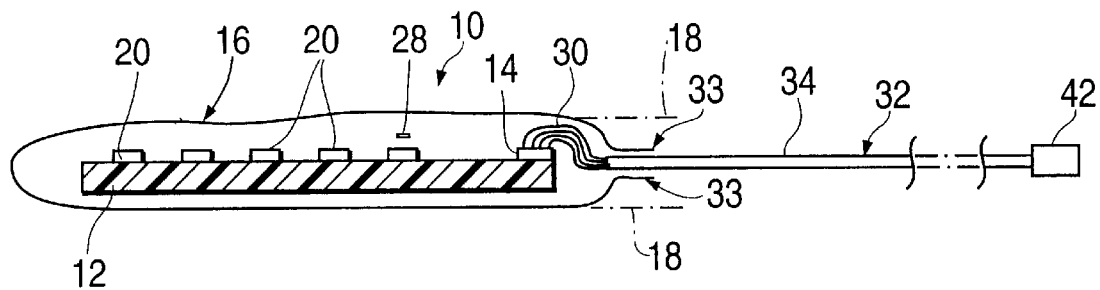
FIG. 1 is a side elevational diagrammatic view in cross-section of an assembly of an electronic device in the form of a printed circuit board disposed within a sealed flexible container and according to a first embodiment.
Figure 2:
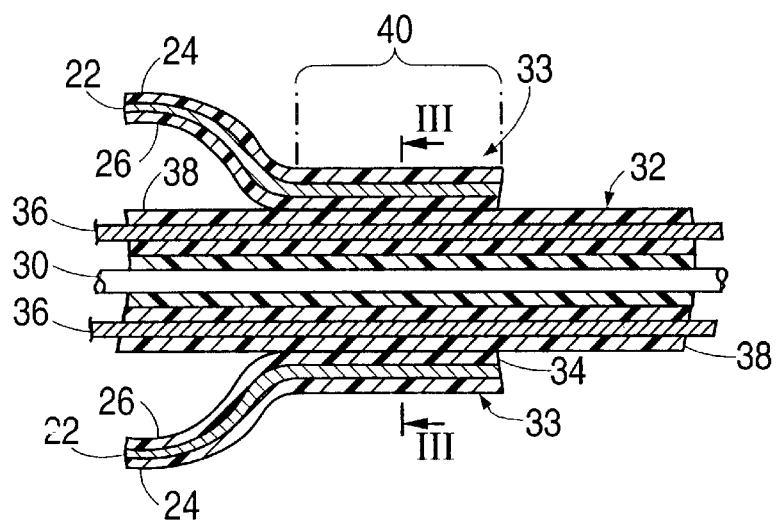
FIG. 2 is a cross-sectional view similar to FIG. 1, but to a larger scale, of part of the assembly of the first embodiment.

In a first embodiment as shown in FIG. 1, an assembly 10 of a printed circuit board and flexible container comprises a printed circuit board 12 of conventional construction, the printed circuit board having an elongate electrical connector 14 connected along one edge region of the board in conventional manner. A flexible container 16 of the assembly is manufactured with an open end 18 (shown in chain-dotted in FIG. 1) and into which the printed circuit board 12 and accompanying connector 14 has been inserted as a subassembly. The container 16 is of laminate construction wall and requires an EMI protection layer for the purpose of preventing or substantially diminishing the amount of electromagnetic radiation penetrating the container either to or from electronic components 20 mounted upon the printed circuit board. For this, as shown in FIG. 2, a thin metal layer 22 (e.g. copper or other suitable conductive material) is provided intermediate inner and outer layers of the container. The layer 22 may be of any desired thickness while being suitable for its desired purpose. It is found that a thickness down to 0.5 mil will suffice. The layer 22 is also imperforate and thus also serves as a moisture or other fluid barrier through the wall of the container. Alternatively, the layer 22 is perforate while still satisfying its EMI protection requirements and a specific moisture impermeable layer (not shown) is then included in the container. This specific layer may,for instance, be made from polyvinylidene chloride, such as sold under the trade name "Saran". An outer layer 24 is required to provide strength to the container and also to have abrasion and cutting resistance. In addition, it should also have dielectric properties. Any suitable polymeric material may do for this purpose, e.g. polyethyleneterephthalate, possibly sold under the trade name "Mylar". Other materials are also suitable including polypropylene or polyamide. The outer layer is of a desired thickness to provide required flexibility. A thickness of at least 1 mil is found suitable.

An inner layer 26 which faces inwardly into a chamber 28 within the container needs also to be of dielectric material. This is basically to prevent shorting of circuitry on the printed circuit board should the container contact any surface of the board or contact any electrical conductor carried by the board. With the particular requirements of the container, it is also necessary for the material of the inner layer to be such that it will fuse and heatseal to itself. A suitable material, and as used in this embodiment, is polyethylene.

Figure 3:
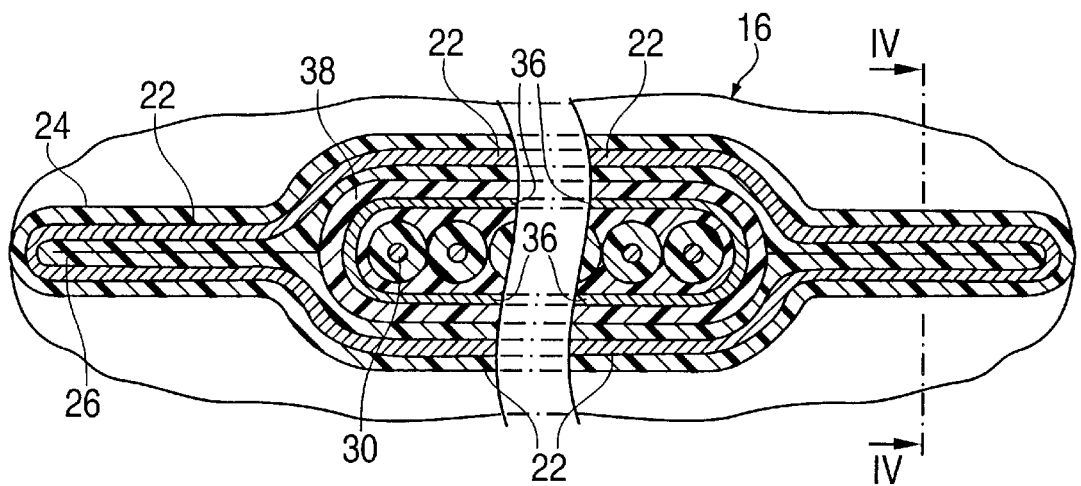
FIG. 3 is a cross-sectional view the assembly taken along line 111—111 in FIG. 2.

The connector 14 has its terminals connected to individually insulated conductors 30 of a flat cable 32 which extends between marginal edge regions 33 of the container at the closed end 34 of the container 16. As shown in FIGS. 1, 2 and 3, marginal edge regions 33 have then been brought together and around the cable, as will now be described in more detail, to seal the open end 18.

Figure 4:
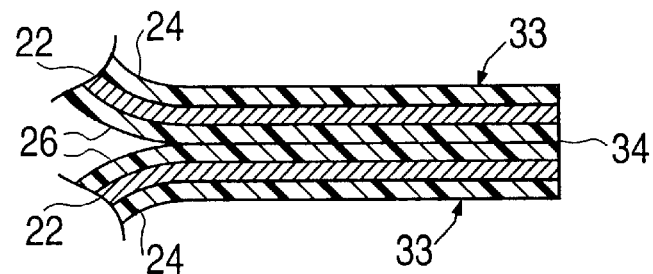
FIG. 4 is a cross-sectional view of part of the assembly taken along line 1V—1V in FIG. 3.

The flat cable 32 has its insulated conductors 30 in a flat array, the conductors being surrounded by a ground conductor 36 which is wrapped around the conductors as a group and lies beneath a polyethylene jacket 38 of the cable. The wrapped ground conductor 36 may be an imperforate layer or a braided layer, for instance, as required. As shown in FIGS. 2 and 3, the cable 32 is narrower than the width of the closed end 34 so that portions of the marginal edge regions 33 disposed laterally of the cable are sealed together with the inside surfaces of the polyethylene inner layer 26 abutted and heatsealed. This is shown in FIG. 4. As shown in FIGS. 2 and 3, other portions of the marginal edge regions 33 are heatsealed to the polyethylene jacket 38 of the cable where the cable passes between the marginal edge regions, the polyethylene of the jacket and the inner layer 26 of the container 16 being compatible for this purpose. The chamber 28 is thus sealed from the outside environment.

The method of sealing the cable within the marginal edge regions effectively seals the marginal edge regions to the jacket along an axial length 40 of the cable, as shown by FIG. 2. Hence, along this axial length the EMI protection layer lies substantially parallel to the ground conductor 36 with the jacket 38 providing a dielectric spacer between the EMI protection layer and the ground conductor. There is, hence, a capacitive coupling between the EMI protection layer and the ground conductor along the axial length 40 of the cable. The capacitive effect produced may short out certain undesirable electrical frequencies to ground from the EMI protection layer, these frequencies otherwise being likely to cause electrical interference with electronic components if allowed to pass through the layer 22. It follows that for the cross-sectional area of cable, as shown by FIG. 3, and for the axial length 40, there are certain overlapping areas of the EMI protection layer 22 and the ground conductor 36 upon which the capacitive effect is dependent. Thus, the axial length 40 for sealing the marginal edge regions 33 to the cable jacket 38 must be determined for the desired capacitive effect.

The cable 32 is connected exteriorly of the container 16 to an external connector 42 for electrical connection of the printed circuit board to electrical means outside the container and for grounding of the EMI protection layer 22.

Figure 5:
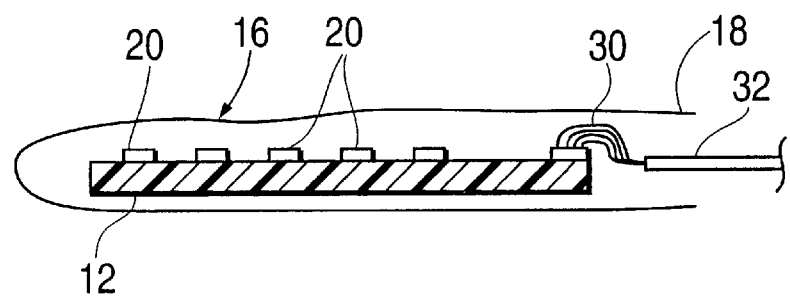
FIG. 5 is a view similar to FIG. 1 showing a stage in the formation of the assembly of the first embodiment.

The making of the assembly 10 is simple as may be seen from FIG. 5. A preformed assembly of the printed circuit board 12, electrical connector 14 and cable 32 with its conductors 30 connected into the terminals of the connector 14 and with the outside connector 42 preferably mounted in position, is used for this purpose. The printed circuit board 12 and electrical connector 14 are passed through the open end 18 of the container 16, as shown in FIG. 5, and with the cable extending through the open end, the marginal edge regions 33 are brought together and closed around the jacket 38 to be sealed as described above. An EMI protected printed circuit board is thus simply and economically produced with the EMI protection layer effectively grounded.

In the above embodiment the marginal edge regions 33 have been described as being heatsealed together and to the jacket 38 of the cable. In modifications of the embodiment, a suitable adhesive is provided between the marginal edge regions and/or between the marginal edge regions and the cable jacket for sealing purposes whereby the heatsealing is unnecessary.

Figure 6:
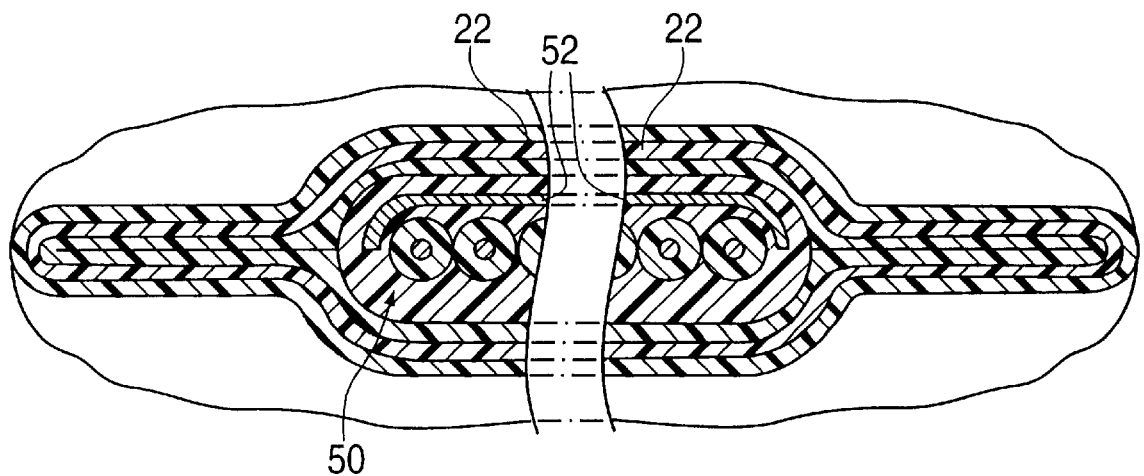
FIG. 6 is a view similar to FIG. 3 of a second embodiment.

In certain constructions, it may be found that the required capacitive effect cannot be produced with a ground conductor extending completely around the signal conductors within the cable while providing the desired axial length 40 of cable sealed to the container 16. In such cases, as shown by a second embodiment in FIG. 6, a cable 50 which is otherwise similar in construction to the cable 32, has a ground conductor 52 provided by a conductive layer extending only partly circumferentially around the cable and beneath the jacket. This circumferential length is to be determined to produce the required overlapping cross-sectional areas of the EMI protection layer and the ground conductor 52 to produce the desired capacitive effect.

What is claimed is:

1. An assembly of a flexible container and an electronic device comprising:

a flexible container defining a sealed chamber and comprising a laminate construction wall which includes a dielectric layer facing inwardly into the chamber and an EMI protection layer surrounding the dielectric layer;

an electronic device located within the chamber and having a plurality of signal terminals;

a plurality of elongate signal conductors which are insulated from each other with each conductor electrically connected to an individual signal terminal of the device and extending outwardly from the chamber for connection to electrical means outside the container, each signal conductor passing through the laminate construction wall while being electrically isolated from the EMI protection layer; and a ground conductor extending through the laminate construction wall and separated from the EMI protection layer by a dielectric spacer to provide a capacitive coupling between the EMI protection layer and the ground conductor.

2. An assembly according to claim 1 wherein the ground conductor and the signal conductors form parts of a common electrical cable extending from the device through the wall of the container, the dielectric spacer comprising a dielectric jacket of the cable surrounding the signal and ground conductors.

3. An assembly according to claim 2 wherein the container has a sealed opening provided for insertion of the device into the chamber before sealing of the opening, and the cable extends through the sealed opening and between regions of the container at the opening and which are sealed to the jacket of the cable.

4. An assembly according to claim 3 wherein the inner surface of the inner layer of the container extends along and is sealed to the cable jacket for an axial length of the cable at the sealed opening to dispose the EMI protection layer substantially parallel to the ground conductor along this axial length and so as to provide the desired capacitive effect.

5. An assembly according to claim 2 wherein the electrical cable is a flat cable.

6. An assembly according to claim 3 wherein the ground conductor is an electrically conductive layer extending circumferentially of the cable at least partly around the signal conductors.

7. An assembly according to claim 6 wherein the ground conductor is an imperforate layer.

8. An assembly according to claim 6 wherein the ground conductor is a braided layer.

9. An assembly according to claim 3 wherein the regions of the container are heatsealed to the jacket of the cable.

10. An assembly according to claim 2 where the container has a sealed opening provided for insertion of the device into the container before sealing of the opening, the sealed opening having a width greater than the width of the cable with first portions of the region of the opening disposed laterally of the cable having confronting surfaces which are sealed together and the cable being heatsealed between second portions of the regions of the opening to dispose the EMI protection layer substantially parallel to the ground conductor.

11. A method of providing an assembly of a flexible container and an electronic device comprising:

providing a flexible container defining a chamber with an opening and comprising a laminate construction wall which includes a dielectric layer facing inwardly into the chamber and an EMI protection layer surrounding the dielectric layer;

passing an electronic device through the opening and into the chamber, and causing a plurality of elongate signal conductors which are insulated from one another and are electrically connected to signal terminals of the device to extend from the chamber through the opening and to the exterior of the container for connection to electrical means outside the container, and also causing a ground conductor to extend through the opening to the exterior of the device; and sealing the opening such that regions of the container at the opening are sealed around the signal conductors and the ground conductor with the EMI protection layer separated from the ground conductor by a dielectric spacer so as to capacitively couple the EMI protection layer with the ground conductor.

12. A method according to claim 11 comprising providing the signal conductors and the ground conductor as parts of a common electrical cable extending from the device through the opening of the container, the cable having a dielectric jacket as the dielectric spacer, the method also comprising sealing the regions of the container at the opening to the dielectric jacket.

13. A method according to claim 12 comprising heatsealing the regions of the container at the opening to the dielectric jacket.

14. A method according to claim 12 wherein the ground conductor is a conductive layer extending circumferentially at least partly around the cable, and the method comprises sealing inside surfaces of the container to the dielectric jacket along an axial length of the cable to dispose the EMI protection layer substantially parallel to the ground conductor along this axial length so as to provide the desired capacitive effect.

* * * * *